US011924573B2

(12) United States Patent
Fossum et al.

(10) Patent No.: US 11,924,573 B2
(45) Date of Patent: Mar. 5, 2024

(54) STACKED BACKSIDE-ILLUMINATED QUANTA IMAGE SENSOR WITH CLUSTER-PARALLEL READOUT

(71) Applicant: TRUSTEES OF DARTMOUTH COLLEGE, Hanover, NH (US)

(72) Inventors: Eric R. Fossum, Wolfeboro, NH (US); Saleh Masoodian, Enfield, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 16/085,847

(22) PCT Filed: Mar. 15, 2017

(86) PCT No.: PCT/US2017/022607
§ 371 (c)(1),
(2) Date: Sep. 17, 2018

(87) PCT Pub. No.: WO2017/161060
PCT Pub. Date: Sep. 21, 2017

(65) Prior Publication Data
US 2019/0098241 A1    Mar. 28, 2019

Related U.S. Application Data

(60) Provisional application No. 62/308,861, filed on Mar. 15, 2016.

(51) Int. Cl.
*H04N 25/79* (2023.01)
*H01L 27/00* (2006.01)
(Continued)

(52) U.S. Cl.
CPC ............. *H04N 25/79* (2023.01); *H01L 27/00* (2013.01); *H01L 27/14621* (2013.01);
(Continued)

(58) Field of Classification Search
CPC ...... H04N 5/378; H04N 5/3745; H04N 5/374; H04N 5/37457; H04N 5/379; H04N 9/04;
(Continued)

(56) References Cited

U.S. PATENT DOCUMENTS 6,380,880 B1 * 4/2002 Bidermann ............ H04N 1/195
341/155
9,225,918 B1 * 12/2015 Fossum .................. H04N 5/374
(Continued)

FOREIGN PATENT DOCUMENTS

CN    102449765 A    5/2012
CN    104576667 A    4/2015
(Continued)

OTHER PUBLICATIONS

International Search Report and Written Opinion issued (dated Jun. 9, 2017) in corresponding International Application No. PCT/US2017/022607. (7 pages total.).
(Continued)

*Primary Examiner* — Chiawei Chen
(74) *Attorney, Agent, or Firm* — Oblon, McClelland, Maier & Neustadt, L.L.P.

(57) ABSTRACT

Some embodiments provide a Quanta Image Sensor (QIS) comprising 3D vertically-stacked photosensor array and readout circuitry. In some embodiments, an imaging array comprises a plurality of single-bit or multi-bit jots, and readout circuitry in electrical communication with the imaging array and configured to quantize, for each jot, an analog signal corresponding to the electrical signal of the jot, wherein the imaging system is configured as a 3D vertically integrated circuit with the imaging array stacked vertically above the readout circuitry. The imaging array may be configured as an array of clusters with respect to the readout circuitry, each cluster configured as an array of n by m jots.
(Continued)

The imaging array may include a further image processing circuitry layer disposed below the readout circuitry layer. Neighboring layers may be implemented on separate substrates and/or in a common substrate.

20 Claims, 7 Drawing Sheets

(51) Int. Cl.
  *H01L 27/146* (2006.01)
  *H01L 49/02* (2006.01)
  *H04N 25/75* (2023.01)
  *H04N 25/77* (2023.01)
(52) U.S. Cl.
  CPC .. *H01L 27/14627* (2013.01); *H01L 27/14634* (2013.01); *H01L 27/14636* (2013.01); *H01L 27/1464* (2013.01); *H01L 27/14645* (2013.01); *H01L 28/00* (2013.01); *H04N 25/75* (2023.01); *H04N 25/77* (2023.01)
(58) Field of Classification Search
  CPC .... H04N 9/045; H04N 9/04555; H04N 25/79; H04N 25/75; H04N 25/77; H01L 27/14645; H01L 27/14612; H01L 27/14621; H01L 27/14641; H01L 27/14643; H01L 27/14689; H01L 27/14627; H01L 27/00; H01L 27/14623; H01L 27/14634; H01L 27/14636; H01L 27/1464; H01L 28/00; G06N 10/00
  See application file for complete search history.

(56) References Cited

U.S. PATENT DOCUMENTS

| | | | | |
|---|---|---|---|---|
| 9,380,245 | B1* | 6/2016 | Guidash | H04N 5/3696 |
| 2010/0097507 | A1* | 4/2010 | Krymski | H04N 5/32 348/308 |
| 2010/0320369 | A1* | 12/2010 | Koskinen | H04N 5/3355 250/226 |
| 2010/0321542 | A1* | 12/2010 | Koskinen | H01L 27/14621 348/273 |
| 2011/0035427 | A1* | 2/2011 | Joseph | H03M 3/462 708/313 |
| 2011/0079869 | A1* | 4/2011 | Mazzillo | H01L 31/085 257/443 |
| 2011/0101205 | A1* | 5/2011 | Tian | H04N 5/332 250/208.1 |
| 2012/0133001 | A1* | 5/2012 | Tkaczyk | H01L 27/20 438/66 |
| 2013/0293753 | A1* | 11/2013 | Keelan | H04N 5/3745 348/302 |
| 2013/0300838 | A1* | 11/2013 | Borowski | G01S 7/486 348/46 |
| 2014/0103190 | A1 | 4/2014 | Lee et al. | |
| 2014/0103193 | A1* | 4/2014 | Lee | H01L 27/14679 257/21 |
| 2014/0104473 | A1* | 4/2014 | Kim | H04N 5/374 348/308 |
| 2014/0175592 | A1* | 6/2014 | Iwabuchi | H01L 27/14689 257/443 |
| 2014/0211056 | A1* | 7/2014 | Fan | H01L 27/14614 348/308 |
| 2015/0115131 | A1* | 4/2015 | Webster | H01L 27/14603 250/208.1 |
| 2015/0323685 | A1 | 11/2015 | Nelson et al. | |
| 2016/0088253 | A1* | 3/2016 | Tezuka | H04N 5/37455 250/208.1 |
| 2016/0172397 | A1* | 6/2016 | Ma | H01L 27/14614 257/292 |
| 2016/0240579 | A1* | 8/2016 | Sun | H01L 27/14647 |
| 2016/0344953 | A1* | 11/2016 | Jeong | H04N 25/00 |
| 2017/0064224 | A1* | 3/2017 | Yoo | G01J 1/46 |
| 2017/0180663 | A1* | 6/2017 | Mabuchi | H04N 25/772 |
| 2017/0186798 | A1* | 6/2017 | Yang | H01L 27/14634 |
| 2017/0214877 | A1* | 7/2017 | Shim | H04N 25/75 |
| 2018/0115724 | A1* | 4/2018 | Motonaga | H04N 25/79 |
| 2018/0227514 | A1* | 8/2018 | Takahashi | H04N 5/3535 |
| 2019/0277970 | A1* | 9/2019 | Deane | G01S 17/42 |
| 2020/0358970 | A1* | 11/2020 | Campbell | H04N 1/2137 |

FOREIGN PATENT DOCUMENTS

| | | |
|---|---|---|
| CN | 104754253 A | 7/2015 |
| TW | 201448184 A | 12/2014 |
| WO | WO 2015/153806 A1 | 10/2015 |
| WO | WO 2017/161060 A1 | 9/2017 |

OTHER PUBLICATIONS

Combined Chinese Office Action and Search Report dated Oct. 31, 2022 in Chinese Patent Application No. 201780030177.8 (with English Translation of Category of Cited Documents), citing references 15-18 therein, 7 pages.

Chinese Office Action dated Jul. 28, 2023 in Chinese Application No. 201780030177.8, with English translation, citing document No. 1 therein, 13 pgs.

\* cited by examiner

STACKED BACKSIDE-ILLUMINATED QUANTA IMAGE SENSOR WITH CLUSTER-PARALLEL READOUT

RELATED APPLICATIONS

This application is filed pursuant to 35 U.S.C. § 371 based on International Application No. PCT/US2017/022607, filed Mar. 15, 2017, which claims the benefit of U.S. Provisional Application No. 62/308,861, filed Mar. 15, 2016, which is hereby incorporated herein by reference in its entirety.

BACKGROUND

Generally, stacked image sensors have been used for decades. In infrared image sensors, hybridized sensors with a detector layer bump-bonded to a readout integrated circuit (ROIC) have been used for infrared imaging. More recently, stacked structures have been formed where one layer (e.g., wafer or die) is interconnected to another layer (e.g., wafer or die) using through silicon-vias (TSVs) made by etching holes in the silicon and backfilling with metal. Other techniques have also been used. Generally, for image sensors, the connections are most frequently made at the periphery of the chip. However, pixel-parallel connections have also been proposed for high throughput. For example, one connection is made for a group of 4 pixels using a microbump. (See, e.g., "A 3D stacked CMOS image sensor with 16Mpixel global-shutter mode using 4 million interconnections," by Toru Kondo, Yoshiaki Takemoto, Kenji Kobayashi, Mltsuhlro Tsukimura, Naohiro Takazawa, Hideki Kato, Shunsuke Suzuki, Jun Aoki, Haruhisa Saito, Yuichi Gomi, Seisuke Matsuda, and Yoshitaka Tadaki in Proc. 2015 International Image Sensor Workshop, Vaals, Netherlands, June 2015).

Figure 1:
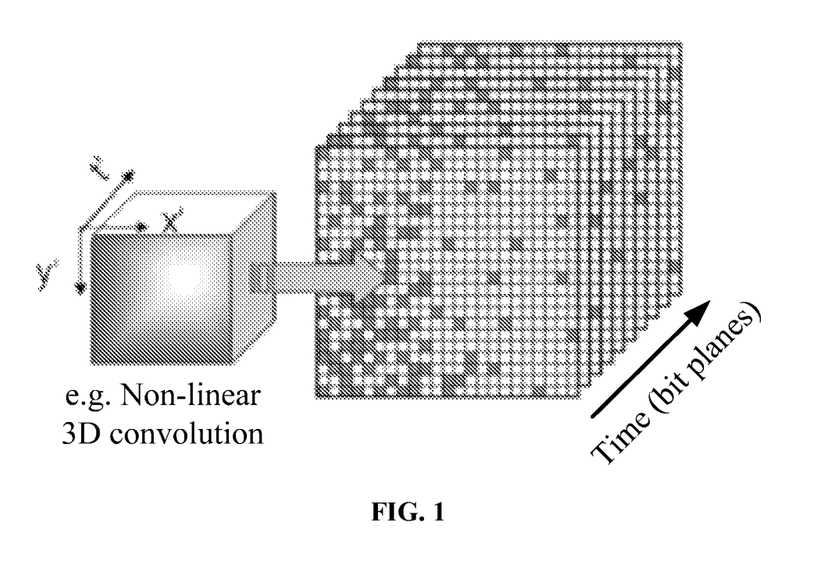
FIG. 1 schematically depicts a concept view of a Quanta Image Sensor (QIS)
Figure 2:
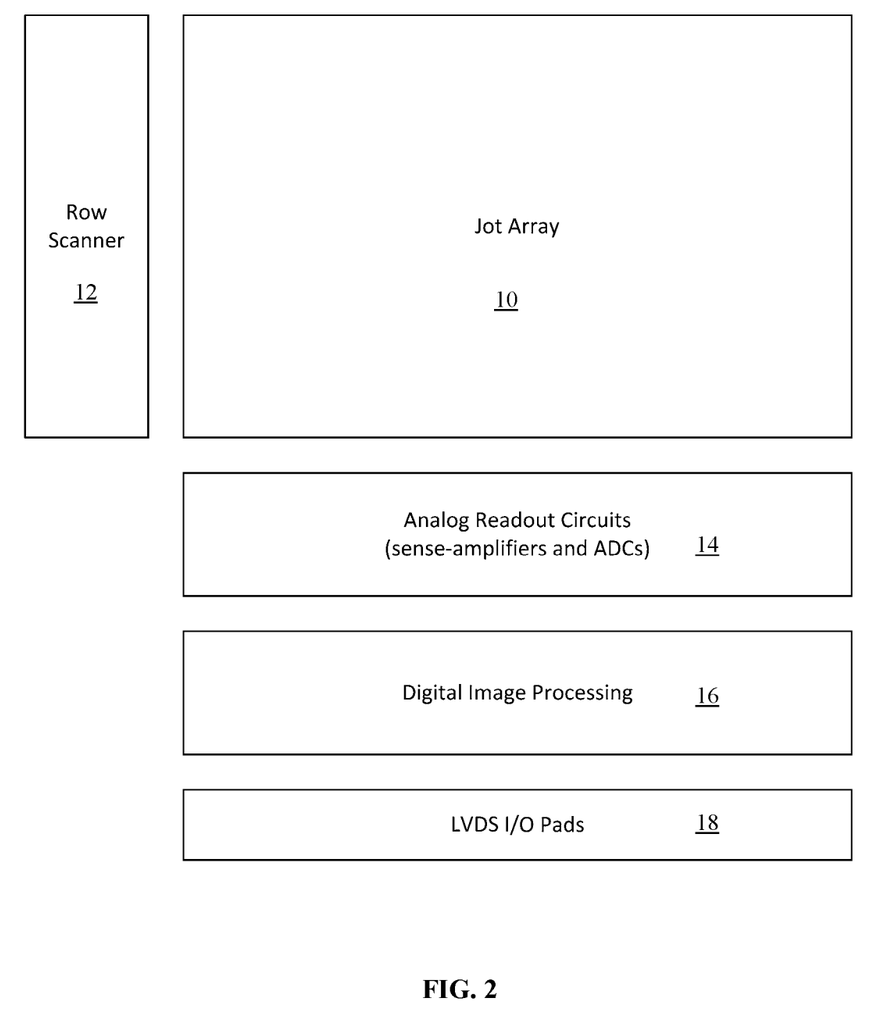
FIG. 2 depicts an illustrative block diagram of a QIS image sensor system.

Quanta image sensor (QIS) is a paradigm shift in imaging to take advantage of shrinking pixel sizes. See, e.g., E.R. Fossum, "What to do with sub-diffraction limit (SDL) pixels?—a proposal for a gigapixel digital film sensor (DFS)," in IEEE Workshop on CCDs and Adv. Image Sensors, Karuizawa, Japan, June 2005, which is hereby incorporated by reference herein in its entirety. Some aspects of various implementations of a QIS include counting individual photoelectrons using sub-diffraction-limit-sized, spatially-oversampled binary photodetectors, called jots, at high readout rates, representing this binary output as a bit cube (x,y,t), and processing the bit cubes to form high dynamic range images. FIG. 1 illustrates such illustrative QIS concepts.

A QIS may contain several giga jots and the speed may be more than 1000 fps, yielding an output data rate of several Gb/s or more. Jot-pitch may, for example, be 500 nm or less. FIG. 1 depicts a block diagram of an illustrative QIS image sensor system, comprising a jot array 10, row scanner 12, analog readout circuitry 14 (e.g., sense-amplifiers and analog-to-digital converters (ADCs)), digital image processing circuitry 16, and I/O pads 18 (e.g., low voltage differential signaling (LVDS) I/O). The jot array 10 consists of M rows and N columns of jots. For example, a giga-jot QIS with a 16:9 aspect ratio may be implemented with 42,000 columns in parallel and each column having 24,000 jots.

There are several problems that should be addressed [2] to realize a QIS camera in a commercially feasible high performance manner. See, e.g., E. R. Fossum, "The quanta image sensor (QIS): concepts and challenges," in Proc. OSA Topical Mtg. on Computational Optical Sensing and Imaging, Toronto, Canada, July 2011, which is hereby incorporated herein by reference in its entirety. Conventional image sensor pixel and circuit techniques cannot address these challenges.

One problem is realizing sub-micron pitch jots with high enough conversion gain (CG) and low enough noise to produce a low bit-error-rate (BER) signal on a column readout bus. SPAD pixels realize photon counting, but due to the intra-pixel circuitry, the pitch of the SPAD is big (>5 um) and the dark current of the SPAD pixel is high.

Figure 3:
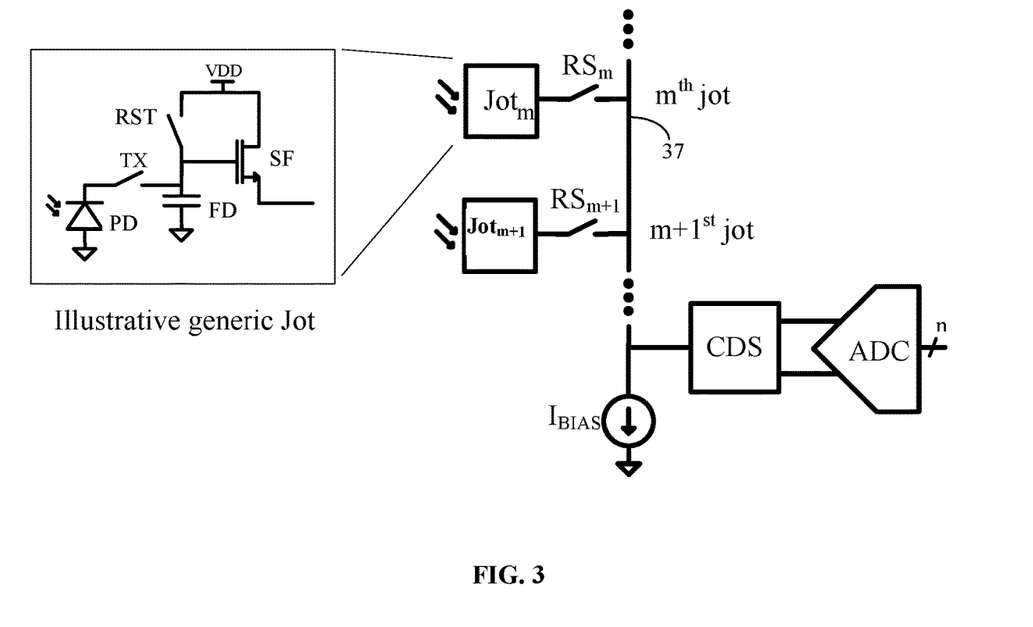
FIG. 3 depicts an illustrative simplified schematic of a portion of one column of jots, in accordance with some embodiments of the present disclosure.

Another problem is implementing high-speed and low-power readout circuits (e.g., biasing the columns, sense-amplifiers (SA) and analog to digital converters (ADCs)) to readout the huge jot array. Perhaps the simplest approach to design readout circuits is to bias each column with a current source, at the bottom of jot array and quantize the outputs of the jots by a sense-amplifier followed by an ADC. A simplified schematic of such an approach is shown in FIG. 3. A main issue with this structure is the limited band-width of the source-follower amplifiers in the jots. For example, in a several-giga-jot QIS cameras, there is parasitic capacitance on the column attributed mainly to the row-select (RS) switches, which connect the column to, e.g., more than 20,000 jots. Moreover, since the column is long, the resistance of the column bus is high. The column bus thus may act as a low-pass filter with a cut-off frequency not high enough to allow thousands fps speeds. Also, since there are more than 20,000 SAs and ADCs which are working in parallel, conventional structures cannot be conveniently used, as the power consumption would be high and the produced on-chip heat will adversely affect the performance of the entire chip.

Yet another problem is transferring the huge amount of raw-data (e.g., ~Gb/s or more) that is produced by the readout circuits to be processed off-chip.

SUMMARY OF SOME EMBODIMENTS

To, for example, address at least the limited bandwidth problem of the source-follower amplifiers in the pixels or jots, some embodiments of the present disclosure provide a stacked QIS, comprising a first layer to implement a jot array and at least one additional layer to implement readout circuitry, with the layers being stacked vertically and having conductive interconnections at least between directly adjacent layers. More than one layer may be used to implement the readout circuitry. Readout circuitry and image processing circuitry may be implemented as separate layers. Separate layers may be implemented as separate substrates and/or formed in/on a common substrate.

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

It will be understood that simply for ease of reference and clarity of exposition with respect to describing, for example, cross-sectional or perspective views of pixels and/or circuitry as may be shown in the drawings, terms such as "upper," "top," "lower," "bottom,""overlying," "underlying,""above" and "below," and the like, with reference to a layer, junction, doped region, or other structure refers to a relative spatial position with respect to the perspective of the depicted view and does not denote a preferred or required orientation. In this regard, it will also be understood that such terms may not have a relation to terms such as "frontside" or "backside" with respect to the surface of the image sensor's wafer/substrate that is configured to be illuminated. For instance, depending on the viewing perspective, a first doped region may be said to overlie or be on top of a second doped region, even though the first doped region might be disposed closer to the "backside" surface of the wafer/substrate (and the image sensor may be configured for backside illumination). It is understood, therefore, as noted, that terminology such as "top," "upper," "bottom," "lower," and the like, as used herein is a convention simply for convenience and ease of reference with respect to referring to different layers, and does not otherwise impart any limitation on the overall design and/or orientation of an image sensor or pixel in accordance with the present disclosure.

In this regard, for ease of reference, as used herein, two layers, regions, or other structures/elements may be referred to as being "adjacent" if they do not include one or more intervening layers, regions (e.g., doped regions), or other structures/elements. In other words, two layers, regions, or other structures/elements referred to spatially (e.g., "on," "above," "overlying," "below," "underlying," etc.) with respect to each other may have one or more intervening layers, regions, or other structures/elements; however, use of the term "adjacent" (or, similarly, "directly," such as "directly on," "directly overlying," and the like) denotes that no intervening layers, regions, or other structures/elements are present.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Prior to further describing a stacked QIS system according to some embodiments of the present disclosure, reference is made to FIG. 3 to schematically depict an illustrative simplified readout signal chain associated with a column of a single bit or multi-bit QIS, such as may be implemented in accordance with some embodiments of the present disclosure. For clarity of exposition, only two neighboring jots (i.e., $Jot_m$ and $Jot_{m+1}$) associated with the same column bus 37 are shown, and also shown are elements comprising an illustrative generic jot, including a photoconversion element PD (e.g., a photodiode), a transfer gate TX, a floating diffusion FD (schematically depicted as a capacitance), a source-follower transistor SF, and a reset switch (e.g., transistor) RST coupled to voltage Vdd. Also, for clarity in depicting that $Jot_m$ and $Jot_{m+1}$ may be independently selectively coupled to column bus 37 (for readout), row-select switches (e.g., transistors) $RS_m$ and $RS_{m+1}$ are depicted outside of $Jot_m$ and $Jot_{m+1}$ (though the row-select switched may be considered as being part of the in-jot readout circuitry). As will be understood, during readout of each one of the jots (e.g., $Jot_m$ or $Jot_{m+1}$), jot output signals (e.g., output from in-jot source-follower amplifier SF) corresponding to the reset level and the accumulated jot signal are coupled to correlated double sampling circuitry CDS via column bus 37, resulting in a corresponding analog signal being coupled to the input of analog-to-digital converter ADC. ADC 37 converts the input analog signal into an n-bit digital signal, wherein the bit width (n) may be one or more depending on the implementation (e.g., single bit or multi-bit). Although not shown, it will be understood that some embodiments may include a programmable gain amplifier PGA (e.g., coupled to, or included as part of, the CDS input).

In accordance with some embodiments of the present disclosure, further described hereinbelow, QIS jots may be implemented as pump-gate (PG) jot devices, which have demonstrated high CG, which is much bigger than read noise, making photon counting possible. See, e.g., J. Ma and E. R. Fossum, "A pump-gate jot device with high conversion gain for a quanta image sensor," *J. of the Electron Devices Soc.*, vol. 3, no. 2, pp. 73-77, 2015; J. Ma and E. R. Fossum, *Quanta image sensor jot with sub 0.3e-r.m.s. read noise and photon counting capability*, IEEE Electron Device Letters, vol. 36(9), pp. 926-928, September 2015; and J. Ma, D. Starkey, A. Rao, K. Odame, and E. R. Fossum, *Characterization of quanta image sensor pump-gate jots with deep sub-electron read noise*, IEEE J. Electron Devices Society, vol. 3(6), pp. 472-480, November 2015, each of which is hereby incorporated herein by reference in its entirety. In addition, in accordance with some embodiments, the QIS jots are configured for backside illumination (BSI). BSI technique allows for designing pixels and jots with better performance. In BSI jots, the photodetector part of the jot is implemented on one side of the substrate and all the connection metals are placed on the other side of the substrate. In view of the present disclosure, however, it will be understood that other sub-micron pitch photo-detector devices having high CG and low read noise (e.g., sufficient for photon counting) may be used as a jot for a QIS device in accordance with some embodiments of the present disclosure.

One approach to address the column biasing issue is to use shared jots. In this manner, for x-way-shared jots, there are x photodetectors, x TX gates, one reset gate, one source-follower and only one RS switch. By using this technique, the parasitic capacitance on the column is reduced by factor of x. The drawback of this approach is that in designing the jot, a low-capacitance floating diffusion (FD) is needed, but by connecting n TX switches to FD, the parasitic capacitance on FD is increased, thus reducing the CG of the jot.

To completely address and overcome such column-biasing issues, embodiments of the present disclosure provide a stacked QIS. According to some embodiments, a stacked QIS uses more than one substrate to provide the QIS, with the substrates being stacked vertically, with circuitry/components on different substrates (e.g., adjacent substrates) being electrically connected by inter-substrate interconnections. In some stacked QIS embodiments, more than one substrate may be used to implement the readout circuits, with these substrates being bonded with interconnections. In various embodiments, rather than disposing circuitry/components on different vertically stacked substrates, the circuitry/components may be implemented as vertically stacked/integrated layers within a common substrate. It will be understood, however, that using a plurality of substrates and using one or more single substrates with a plurality of layers are not mutually exclusive embodiments.

Figure 4:
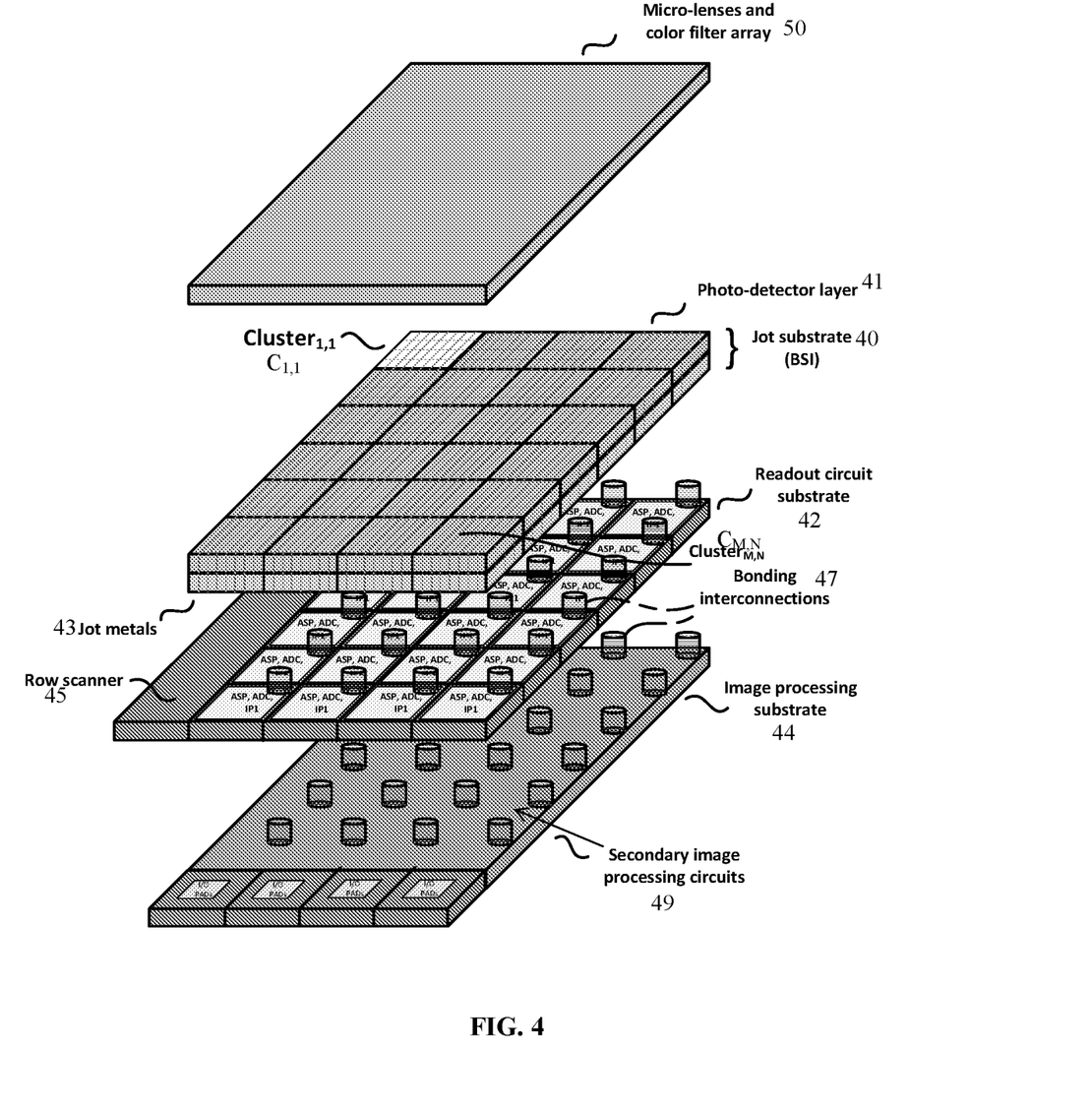
FIG. 4 schematically depicts a perspective, exploded view of a QIS implemented with a plurality of vertically stacked substrates, in accordance with some embodiments of the present disclosure.
Figure 5:
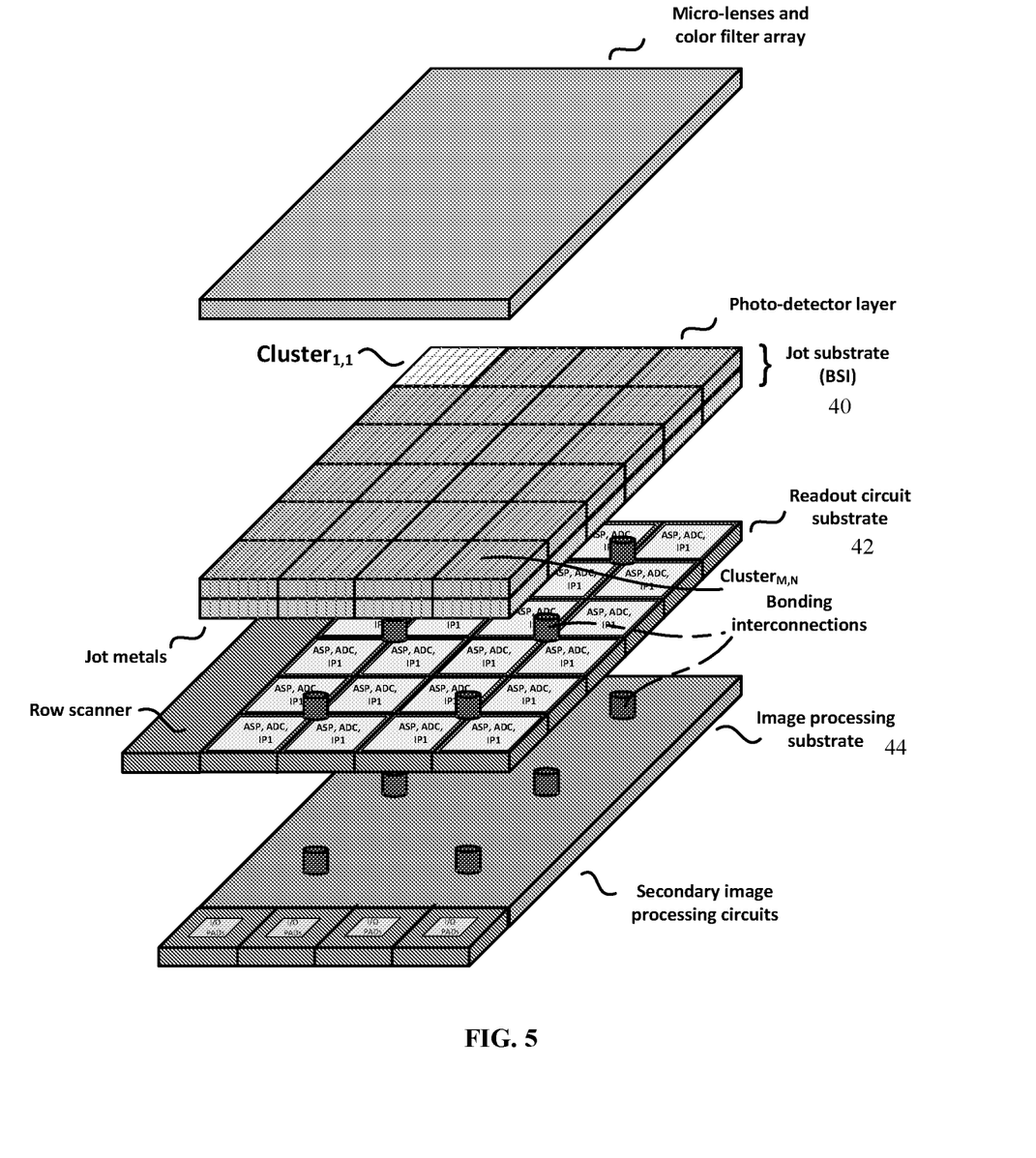
FIG. 5 schematically depicts a perspective, exploded view of a QIS implemented with a plurality of vertically stacked substrates, in accordance with some embodiments, in accordance with some embodiments of the present disclosure.

Some embodiments of a QIS implemented with a plurality of vertically stacked substrates are illustrated in FIGS. 4 and 5. As shown, the QIS system comprises jot substrate/die 40 comprising an array of jots, readout circuit substrate/die 42 comprising readout circuitry and row scanner circuitry 45, and image processing substrate/die 44 comprising image processing circuitry 49. In other words, the readout and image processing circuits to readout the jots on the first substrate 40 are implemented on respective second and a third substrates 42 and 44. In these illustrative embodiments, jot substrate 40 is configured as a backside-illuminated (BSI) jot sensor chip having "upward" facing photodetector layer 41 and "downward" facing jot metallization layer for interconnection via bonding interconnections 47 with readout circuitry on readout substrate 42. It will be understood that FIGS. 4 and 5 are illustrative isometric exploded views of the stacked QIS, showing the substrates as spatially separate for clarity of exposition. That is, the stacked QIS is formed with the substrates being vertically stacked, adjoined by the conductive bonding interconnections 47. As shown, the stacked QIS may also include a micro-lens and color filter array layer 50 disposed on the photodetector layer 41.

It is further noted that FIG. 4 schematically depicts the stacked QIS being configured with one bonding interconnection for interconnecting each respective jot cluster (on the jot substrate 40) to a respective readout circuit (on the readout circuit substrate 42). Likewise, it schematically depicts the stacked QIS being configured with one bonding interconnection for interconnecting each respective readout circuit (on the readout circuit substrate) to a respective secondary image processing circuit (on the image processing substrate 44).

FIG. 5 likewise provides (i) respective individual bonding interconnections between respective jot clusters and respective readout circuits (on the readout circuit substrate 42), and (ii) respective individual bonding interconnections between respective readout circuits (on the readout circuit substrate 42) and respective secondary image processing circuits 49 (on the image processing substrate 44). But, in accordance with some alternative implementations, each depicted bonding interconnection in FIG. 5 comprises four respective bonding interconnections for interconnecting respective circuits on the neighboring substrates. In other words, by way of non-limiting example, the illustrative embodiments of FIGS. 4 and 5 have essentially identical circuit layouts, but are implemented with different fabrication processes for forming bonding interconnections.

A QIS camera may comprises of a billion or more jots which are organized as an array of M row and N column jots. As used herein, a cluster of jots is a sub-array of m rows and n columns of jots, with m and n being greater than 1. Simply by way of non-limiting example, a QIS may be implemented as an array of clusters, wherein each cluster is, e.g., a 4×4, 8×8, 16×16, or 32×32 array of jots (though the cluster need not be square; i.e., m is not necessarily equal to n). A QIS may thus comprise an M×N array of jots, organized as a P×Q array of clusters, where each cluster comprises an m×n array of j ots (thus, M=(P)(m); and N=(Q)(n)).

Simply by way of non-limiting example and for clarity of exposition, in FIGS. 4A and 4B, the illustrative array (which may be considered a portion of a QIS array comprising, e.g., a billion or more jots) consists of 24 (M) rows and 32 (N) columns and 768 jots. In this example, there are 24 jot clusters (bold lines; i.e., a 4×6 array of clusters) and each cluster contains 32 jots which arranged as 8 (m) rows and 4 (n) columns. As shown, a color filter array may be disposed above the jots. Depending on the design of the QIS camera, the jots in a cluster may all be under the same color filter, or under a color filter array. In this embodiment, the second substrate is the readout circuit substrate. As can be seen in FIGS. 4A and 4B, there is an analog signal processing (ASP) unit, an ADC and primary image processing (IP1) blocks under each jot cluster. The jot clusters are connected to the underneath readout circuit blocks via bonding interconnections. In this embodiment, the third substrate is image processing substrate. The digital circuits in this layer process the data coming from the readout circuit blocks of layer 2 via bonding interconnections to form the final image. After forming the final image, the image data is sent out off-chip via I/O pads.

Figure 7:
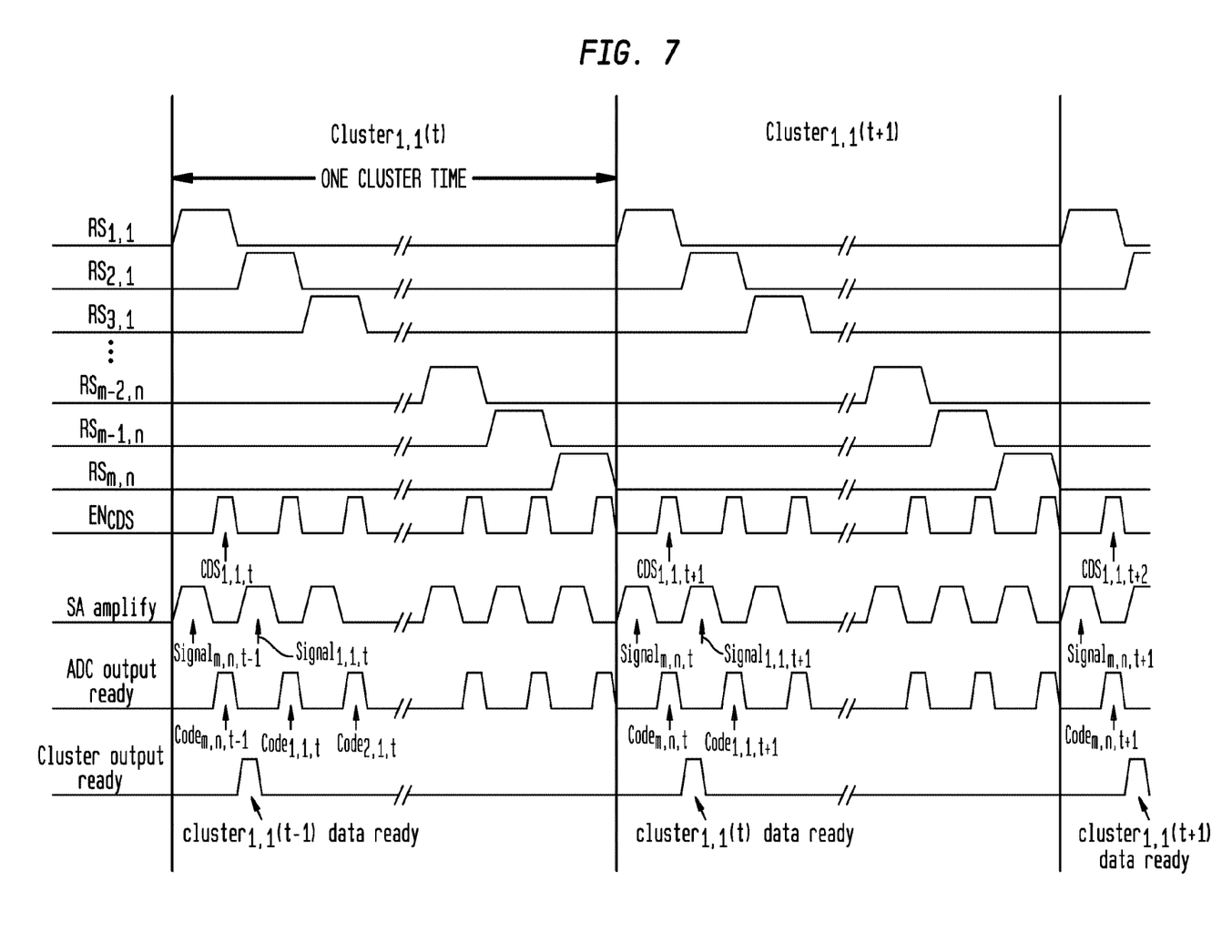
FIG. 7 illustrates a timing diagram corresponding to one cluster of jots in a stacked QIS, in accordance with some embodiments of the present disclosure.

In accordance with some embodiments, FIG. 7 shows an illustrative overall block diagram and simplified schematics of one cluster of jots, ASP, ADC, and primary IP, as configured for a stacked QIS.

The signaling function of QIS system in accordance with some illustrative embodiments is explained here. There are m×n jots in each cluster which organized as an array with m rows and n columns. In each cluster, the RS switches turn on and off, one after another one; viz., the RS switches turn on and off sequentially and only one RS switch is connected to the column bus in a cluster at a time. Only one RS switch is connected at a time. During the selection of one jot, the reset and signal voltage levels are stored on the correlated double sampling (CDS) unit. A differential charge transfer amplifier (CTA) amplifies the signals stored in the CDS on the level which is bigger than input referred offset and input referred noise of the ADC. All the clusters work in parallel. ADC can be single-bit or multi-bit, based on the readout structure of the entire image sensor system. If the QIS image sensor would be single-bit QIS, the ADC is single bit, such as a D-latch comparator, and if the QIS camera would be multi-bit QIS, multi-bit ADC is used.

After quantization of the signal by ADC, a simple digital processing is done on the digital signal by image processor (IP1) and the output is saved in a memory. The simple digital process can be an adder or a digital convolver. The next ADC output, which is the quantized output of the subsequent jot, is summed or convolved with the value stored in the memory. This process continues until all the jots in the cluster have been readout. At this moment, the value stored in the memory, and all other clusters memories are transferred to chip level image processor for further processing.

After reading one cluster of jots, the cluster readout is re-done for the next frame. A simplified waveform/timing diagram which shows functioning of one cluster of jots in accordance with some embodiments is shown in FIG. 7. By using this method, the bandwidth of the columns in clusters are wide enough to produce thousands of frames per second while consuming very low-power.

The following further describes illustrative implementations of various stacked QIS components in accordance with some embodiments.

a) Cluster-Level BSI Jot Layer

Jots can be designed for shared or non-shared readout; in other words, a group of jots can share one reset gate, one SF and one RS switch. Jots can be single-bit or multi-bit.

b) CDS, SA and ADC

The analog signal processing can be designed in many different ways. CDS block can be designed with active or passive circuits; however, passive CDS is more suitable for low-power purposes. According to the structure of the QIS camera (multi-bit or single-bit), different types of ADCs are used. Regardless of the type of the ADC, wherever, an implementation of sense-amplifier or amplifier is needed, charge transfer amplifier is used to reduce the power consumption. A continuous-time amplifier can be used for low-resolution QIS cameras for specific applications. For single-bit QIS, a CTA followed by a comparator may be used. CTA amplifies the signal level to be more than the input-referred offset and noise of the comparator. A D-latch comparator is a low-power candidate to be used as comparator.

In multi-bit QIS, different types of ADCs, such as single-slope (SS) and algorithmic ADCs (such as successive approximation register (SAR) and cyclic) can be used. In all of these ADCs, several comparators and amplifiers are used. For power reduction purposes, CTA should be used. In some embodiments, the bit-width (n) of the ADC may be programmable.

c) Digital Kernel and Memory

Figure 6:
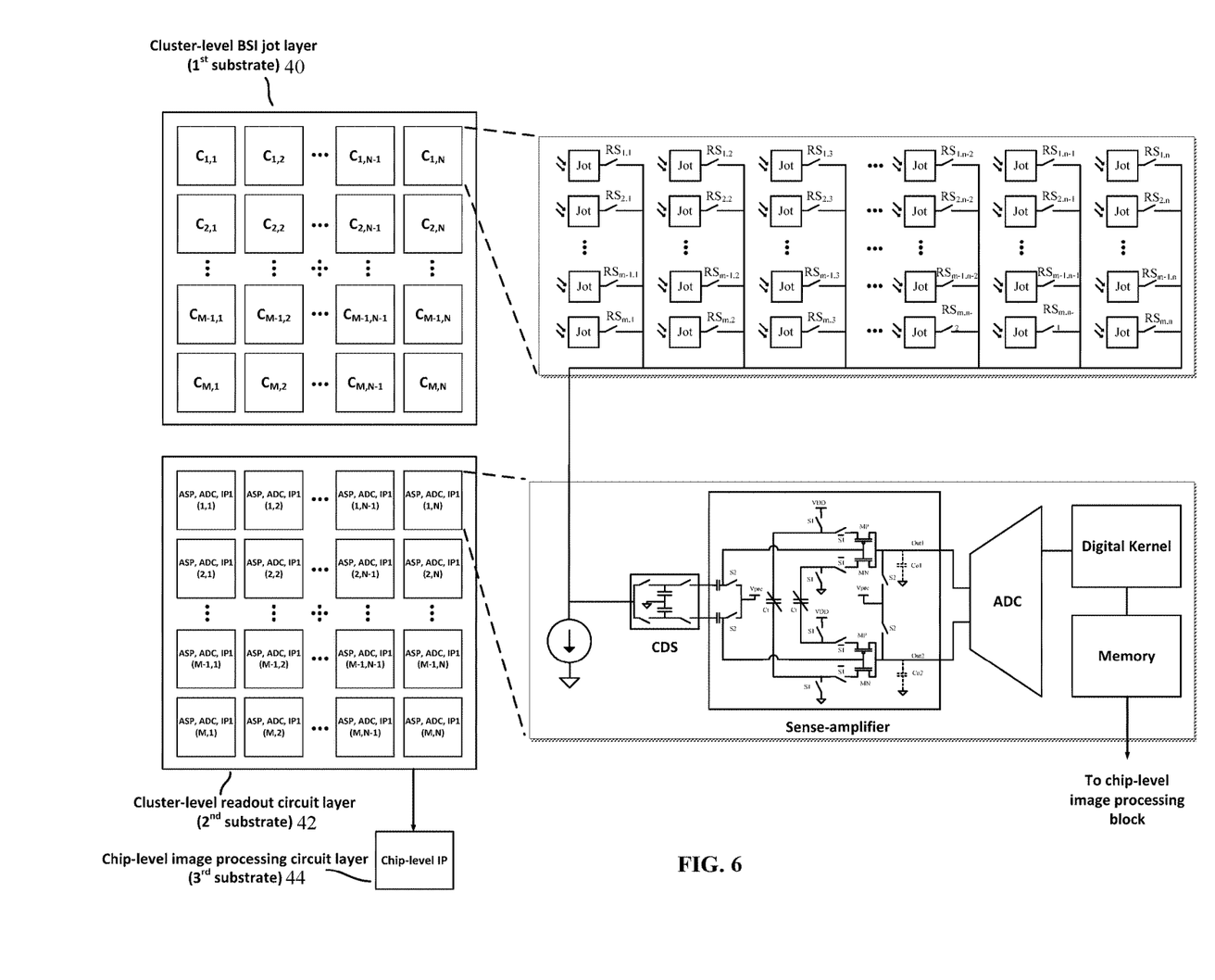
FIG. 6 depicts an illustrative block diagram of jot clusters, readout circuits and image processing layers, in accordance with some embodiments of the present disclosure.

Digital kernel is a simple signal processing block (IP1 in FIGS. 4 and 5, and digital kernel block in FIG. 6) which processes the signal which is received from ADC and the stored signal in the memory. This block can be a simple adder or convolver, based on the algorithm which QIS camera is using to form the image. Since there is one digital kernel, and memory is implemented in every cluster in the QIS camera, they must be ultra-low-power. For this purpose, sub-threshold regime CMOS circuits are used in accordance with some embodiments.

Based on the image forming algorithm, the digital kernel may perform a function on adjacent jots of the same color, where the function may include jots of adjacent clusters. That is, the function is over S jots, where S may be larger, equal to, or smaller than C, where C is the number of jots in a cluster.

d) Chip-Level Image Processing

The chip-level image processor can be implemented on-chip or off-chip. To reduce the power consumption and increase the performance of the QIS image sensor, it is better to implement it on-chip on a separate substrate and stack it to the other layers with bonding interconnections. After processing the image, several interface protocols, such as SPI, I2C, LVDS and camera link can be used to send the data of the image off-chip.

As an example, in a giga jot, 1000 fps QIS camera with 16:9 aspect ratio, with cluster size of 32 (m)×32 (n), there are 42,000 columns (N) and 24,000 (M) rows of jots and 984,750 clusters as 750 row and 1313 column.

In this system, there are 984,750 current sources, CDSs, SAs, ADCs, IP1s, 256-bit memories and one chip-level image processor. The sampling rate of the CDS, SA, ADC, IP1 and memory is 1 MSa/s. Considering 2 W as the power budget for entire chip, 0.5 W may be consumed in chip-level image processing and pad frame, and the rest of 1.5 W budget, provides almost 1.5 µW per cluster. Using an advanced CMOS process, such as a 45 nm technology node, and implementing charge transfer circuits in the analog domain and sub-threshold regime operation in the digital domain, makes it possible to design the blocks for each cluster to consume less than 1.5 µW power.

It should be mentioned that, by using a digital kernel and memory, the output data rate may be reduced significantly, although post-readout processing flexibility is reduced. In the above example, if no image processing were implemented on-chip, then the output data rate is about 1 Tb/s; whereas, by using simple digital kernels in each cluster, the output data rate may be reduced, for example, to about 8 Gb/s. Using a $3^{rd}$ stacking layer (e.g., $3^{rd}$ substrate) for chip-level image processing can reduce the output data rate to, for example, the standard data rates as in conventional cameras.

The present invention has been illustrated and described with respect to some specific illustrative embodiments thereof, which embodiments are merely illustrative of some of the principles of some embodiments of the invention and are not intended to be exclusive or otherwise limiting embodiments.

For example, in view of the present disclosure, it will be understood that depending on various design considerations and/or constraints, such as stacking technology design rules (e.g., density of inter-substrate interconnects, maximum number of stacked die/wafers, etc.), many alternative configurations are possible. For instance, image sensor circuitry may be provisioned in various ways among stacked substrates. By way of non-limiting example, ADCs may be implemented on a stacked substrate that is separate from the substrate on which the sense-amplifier circuitry is formed. Additionally or alternatively, certain typically in-pixel readout circuitry (e.g., source-follower and readout-select transistors) may be disposed on a stacked substrate separate from the substrate on which other in-pixel (in-jot) circuitry (e.g., photodetector, transfer gate, floating diffusion) is formed (and separate from a substrate on which the ASP circuitry is formed), which may provide for higher jot areal density (smaller jot pitch).

As a further example of variations within the purview of the present disclosure, while the foregoing illustrative embodiments provide for coupling each jot cluster to a respective readout circuit using one conductive interconnect, various embodiments may employ a different number of interconnects between respective clusters and readout circuits. For instance, in some embodiments jots can be readout differentially. In such embodiments, two conductive interconnections may be provided between each readout unit in readout-circuit-cluster and the jot cluster above it. In various such implementations, the differential signal may be connected to a differential jot structure (i.e., each jot provides two outputs for differential output) and/or may be connected to respective individual outputs of two jots (e.g., two neighboring jots). Similarly, the number of interconnects between different pairs of adjacent substrates need not be equal.

In addition, while the illustrative stacked QIS embodiments employ 3D integration techniques that stack separate substrates (e.g., whether die-to-die, die-to-wafer, or wafer-to-wafer) to vertically integrate separately-fabricated devices/circuits on the substrates, various alternative embodiments are not limited to such 3D integration techniques and may comprise, for example, monolithic 3D integration techniques that provide for formation and vertical integration of circuitry on separate tiers.

Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An imaging system, comprising:
   an imaging array comprising a plurality of jots that are single-bit or multi-bit, wherein each jot of the plurality of jots is configured to generate a respective electrical signal in response to photon absorption; and
   readout circuitry in electrical communication with the imaging array and configured to quantize, for each jot of the plurality of jots, a respective analog signal corresponding to the respective electrical signal of the jot, wherein the imagine system is configured as a three-dimensional (3D) vertically integrated circuit with the imaging array stacked vertically above the readout circuitry,
   wherein the imaging array is configured as a plurality of clusters, each cluster of the plurality of clusters comprising a respective group of said plurality of jots,
   each respective cluster of the plurality of clusters is electrically coupled to and configured to be read out by a respective readout circuit block of the readout circuitry,
   each readout circuit block comprising a respective primary image processor configured to perform digital signal processing of respective jot signals to generate a respective digital value corresponding to the respective cluster based on a respective processing digital signal corresponding to the respective electrical signal generated by each jot read out from the respective cluster for a given frame, such that an output data rate of the imaging system is reduced, and
   the respective digital value corresponding to the respective cluster for the given frame is stored in a respective memory.

2. The imaging system according to claim 1, wherein the imaging array is configured as an array of the clusters with respect to the readout circuitry, wherein each cluster is configured as an array of n by m jots, wherein n and m are each an integer greater than one.

3. The imaging system according to claim 2, wherein a color filter array layer is disposed over the plurality of jots, and wherein either (i) all jots in a particular cluster are disposed under a common color filter element of the color filter array layer, or (ii) different jots in the particular cluster are disposed under two or more different color filter elements of the color filter array layer.

4. The imaging system according to claim 2, wherein the jots in different clusters are read out in parallel.

5. The imaging system according to claim 1, wherein the readout circuitry and the imaging array are implemented on separate substrates that are bonded to each other by conductive interconnections.

6. The imaging system according to claim 5, wherein the imaging array is configured as an array of the clusters with respect to the readout circuitry, wherein each cluster is configured as an array of n by m jots, wherein n and m are each an integer greater than one,
- each respective cluster of jots is read out by a respective analog processing circuit and a respective analog-to-digital converter (ADC) included within the respective readout circuit block, and
- the respective readout circuit block is disposed beneath the respective cluster and in the readout circuitry substrate.

7. The imaging system according to claim 6, wherein the ADCs are configured as any one of single-bit, multi-bit, or programmable bit-width resolution.

8. The imaging system according to claim 1, wherein the plurality of jots are configured for shared or non-shared readout.

9. The imaging system according to claim 1, wherein charge transfer amplification is implemented in the readout circuitry to provide gain.

10. The imaging system according to claim 1, wherein the readout circuitry and the imaging array are implemented on separate substrates that are bonded to each other by conductive interconnections,
- the imaging array is configured as an array of the clusters with respect to the readout circuitry,
- each respective cluster of the plurality of clusters is configured as an array of n by m jots, wherein n and m are each an integer greater than one, and
- the respective readout circuit block corresponding to each respective cluster includes (i) the respective primary image processor configured as a respective digital kernel, and (ii) the respective memory, the respective primary image processor being configured to perform respective digital signal processing of respective jot signals, and the respective memory being configured to store a respective result of the respective digital signal processing by the respective primary image processor.

11. The imaging system according to claim 10, wherein the respective digital kernel is operated in in subthreshold regime to reduce power consumption.

12. The imaging system according to claim 1, wherein the readout circuitry and the imaging array are implemented on separate substrates that are bonded to each other by conductive interconnections, and
- the readout substrate includes circuitry configured to scan out the plurality of jots.

13. The imaging system according to claim 1, further comprising image processing circuitry in electrical communication with, and stacked vertically below, the readout circuitry, and configured to process each respective digital value stored in each respective memory and corresponding to each respective cluster of the plurality of clusters.

14. The imaging system according to claim 13, wherein the readout circuitry, the imaging array, and the image processing circuitry are implemented on three separate substrates that are bonded to each other by conductive interconnections.

15. The imaging system according to claim 14, wherein the image processing substrate includes circuitry configured to transmit data corresponding to jot signals off-chip.

16. The imaging system according to claim 1, wherein the imaging array is configured for backside-illumination.

17. The imaging system according to claim 1, wherein the plurality of jots have a pitch of not more than 500 nm.

18. The imaging system according to claim 1, wherein the 3D vertically integrated circuit includes at least four vertically stacked layers of circuitry, one of the at least four vertically stacked layers comprising the imaging array.

19. The imaging system according to claim 1, wherein the readout circuitry is configured to read out the jots using correlated double sampling.

20. The imaging system according to claim 1, wherein each readout circuit block comprises a respective analog-to-digital converter (ADC) configured to sequentially generate a respective quantized output signal corresponding to the respective electrical signal generated by each jot read out from the respective cluster corresponding to the respective readout circuit block, and
- each of the respective primary image processors comprises a respective kernel that is configured to generate the respective digital value corresponding to the respective cluster for the given frame based on (i) digitally processing a first of respective quantized output signals for the given frame and storing a first respective result in a first respective memory, and (ii) for the given frame, sequentially digitally processing each subsequent one of the respective quantized output signals together with the first respective result stored in the first respective memory and storing a subsequent respective result in a subsequent respective memory.

\* \* \* \* \*